United States Patent

Harrington et al.

[11] Patent Number: 6,008,677
[45] Date of Patent: Dec. 28, 1999

[54] VOLTAGE RECOVERY CIRCUIT AND METHOD THEREFOR

[75] Inventors: Cheri Lynn Harrington; Thomas Jew; Kishna Weaver, all of Austin; Thomas R. Toms, Dripping Springs; Yongliang Wang, Austin, all of Tex.

[73] Assignee: Motorola, Inc., Schaumburg, Ill.

[21] Appl. No.: 09/053,896

[22] Filed: Apr. 2, 1998

[51] Int. Cl.$^6$ .................................................. G11C 13/00
[52] U.S. Cl. ........................ 327/142; 327/141; 327/148; 327/535; 327/536; 327/538
[58] Field of Search ....................... 365/189.01; 327/142, 327/141, 148, 535, 536, 538

[56] References Cited

U.S. PATENT DOCUMENTS

| | | | |
|---|---|---|---|
| 5,418,677 | 5/1995 | Engel | 361/25 |
| 5,444,664 | 8/1995 | Kiroda et al. | 365/226 |
| 5,473,271 | 12/1995 | Little et al. | 327/108 |

OTHER PUBLICATIONS

Motorola Inc., 1995, "Power is Control", Motorola Power PC™Microcontrollers, MPC500 Family System Integration Unit Reference Manual, pp. 8–2 to 8–8.

*Primary Examiner*—Viet Q. Nguyen

[57] ABSTRACT

A method an apparatus for performing a reset operation in an integrated circuit where a memory programming voltage is recovered allowing use of the memory during reset. The voltage recovery unit includes a high voltage conversion portion active for a first recovery period, and a low voltage conversion portion active for a subsequent second recovery period, the low voltage conversion portion is inactive for the first recovery period. The first and second recovery portions are responsive to assertion of a reset signal and an intermediate reset signal generated before the end of the reset period. Recovery of the programming voltage allows uncorrupted retrieval and use of a configuration word during reset. The high voltage conversion portion includes p-channel devices with robust breakdown resistance, and the low voltage conversion portion includes n-channel devices which provides improved speed of operation.

7 Claims, 4 Drawing Sheets

VOLTAGE RECOVERY CIRCUIT AND METHOD THEREFOR

FIELD OF THE INVENTION

The present invention relates generally to integrated circuits, and specifically to high voltage recovery circuits, such as used with programmable memory or analog-to-digital conversion.

BACKGROUND OF THE INVENTION

As new technologies are developed to achieve smaller and smaller integrated circuit geometries, voltage differentials and frequency of operation present problems in circuit design and device selection. One such problem exists where the design technology limits the breakdown voltage of n-type devices. Typically, n-type devices operate more quickly than p-type devices, but are limited in voltage range. As physical geometries decrease there is a resultant decrease in the breakdown voltage of n-type devices. At higher voltages, the breakdown of n-type devices may be violated. It is desireable to design circuits which satisfy the voltage requirements of n-type devices while maintaining performance of the circuit.

Integrated circuits often include a charge pump for controlling the voltage supply of an analog-to-digital converter or memory programming circuit. At smaller geometries, the voltages necessary for control and operation of these voltage supplies is beyond the voltage range of n-type devices. There is a need for a method of handling the supply voltages while maintaining the speed of the circuit and maintaining efficient production.

In the drive to reduce the size of the integrated circuit, it is desirable to minimize the circuitry and logic necessary to incorporate features. Designers seek to optimize the use of a memory in performing reset and other maintenance operations. When a memory is part of the data processing system, it is desirable to use that memory for efficient reset operations. When the memory is a programmable memory there is often an associated charge pump to generate a programming voltage. Prior to use during a reset operation, it is desirable to ensure that any programming voltages have been recovered to a lower voltage level. There is a need for a reset method which uses a programmable memory without corrupting data from that memory.

DETAILED DESCRIPTION OF PREFERRED EMBODIMENTS

Figure 1:
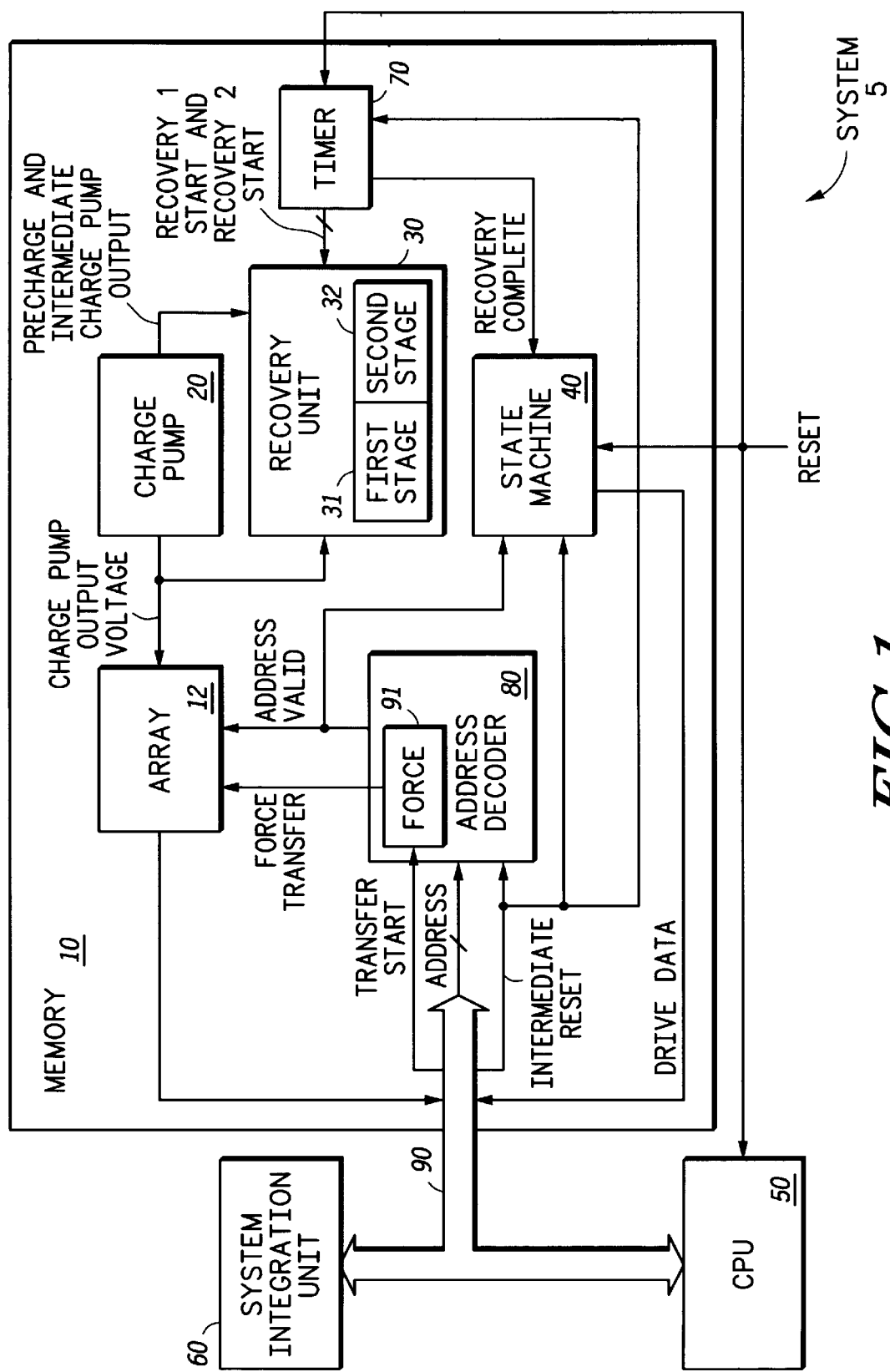
FIG. 1 illustrates in block diagram form a data processing system according to one embodiment of the present invention.

In the following description, numerous specific details are set forth such as specific control register bit lengths, etc. to provide a thorough understanding of the present invention. However, it will be obvious to those skilled in the art that the present invention may be practiced without such specific details. In other instances, circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The term "bus" will be used to refer to a plurality of signals or conductors which may be used to transfer one or more various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

In one aspect of the present invention, a voltage recovery unit includes a high voltage conversion portion active for a first recovery period and a low voltage conversion portion active for a second recovery period, wherein the low voltage conversion portion is inactive for the first recovery period, wherein the second recovery period is subsequent to the first recovery period.

In another aspect of the present invention, a data processing system includes a central processing unit, a communication bus coupled to the central processing unit, a memory coupled to the communication bus having a memory array, a charge pump coupled to the memory array, a recovery unit coupled to the charge pump, the recovery unit having a first portion and a second portion, the first portion active during a first recovery period and the second portion active during a second recovery period, and a timer, the timer generating a first recovery signal and a second recovery signal to the recovery unit, the first recovery signal indicating start of the first recovery period and the second recovery signal indicating start of the second recovery period.

In one embodiment of the invention, a method of voltage recovery includes the steps of asserting a first recovery signal; loading a counter with a first recovery value; asserting a second recovery signal in response to expiration of the counter; and loading the counter with the second recovery value; wherein the first recovery value corresponds to a high voltage recovery period and the second recovery value corresponds to a low voltage recovery period.

In still another embodiment, a memory device includes an array of memory cells; a timer; a charge pump coupled to the array of memory cells; a recovery unit coupled to the charge pump and the timer, the recovery unit active during a recovery period, the recovery unit including a first portion, wherein in response to a first signal from the timer the first portion converts a voltage from a first level to a second level; and a second portion, wherein in response to a second signal from the timer the second portion converts the voltage from the second level to a third level, wherein the first level is of greater magnitude than the second level and the second level is of greater magnitude than the third level.

In reference to FIG. 1, data processing system 5, according to one embodiment of the present invention, is illustrated including memory 10, system integration unit 60 and central processing unit (CPU) 50 coupled by way of communication bus 90. Memory 10 includes array 12, charge pump 20, recovery unit 30, timer 70, state machine 40, and address decoder 80. Charge pump 20 is used to provide programming or erasing voltage to array 12. A higher voltage is typically necessary to modify the information within the memory cells within array 12. After programming, recovery unit 30 is used to convert the higher voltage down to a lower voltage for normal operation of memory 10. Often, the programming voltage is reduced to approximately ground, but may be converted to any reference voltage according to the application. For example, charge pump voltages associated with analog-to-digital converters or electrically erasable programmable read only memory (EEPROM) are typically converted to a lower level for normal operation.

Recovery unit 30 is coupled to timer 70. Timer 70 provides the clocks and reference timing needed for operation of recovery unit 30. Recovery unit 30 and array 12 receive an output voltage from charge pump 20. Operation of recovery unit 30 begins after programming of array 12 is completed. Recovery unit 30 includes a first stage 31 and a second stage 32. The first stage 31 is active during a first portion of the recovery period, where the first portion is indicated by signals from timer 70. The second stage 32 is active during a second portion of the recovery period, where the second portion is also indicated by signals received from timer 70. When a reset is indicated, either by internal event(s) within system 5 or by an external reset (sometimes referred to as a "hard reset"), a RESET signal is provided to state machine 40 and to timer 70. The reset period begins on assertion of the RESET signal. Timer 70 receives an "intermediate reset" signal from system integration unit 60. The intermediate reset signal indicates a midpoint in the reset time period. Timer 70 then provides signals to recovery unit 30 based on the intermediate reset signal period. The signals from timer 70 indicate the first portion and second portion of the recovery period, where the recovery period is concurrent with the reset period, but the recovery period is completed within the reset period.

Continuing with memory 10 of FIG. 1, address decoder 80 receives address information and a transfer start signal from by way of communication bus 90. Address information and the transfer start signal are generated by the system integration unit 60. Address decoder 80 includes a force unit 91 that will force a data transfer from array 12 during reset. During reset it is necessary to obtain various condition and parameter information. One embodiment of the present invention stores such reset information in memory, such as array 12. On reset, the information is retrieved from array 12, and used to effectively reset the part (i.e. place the device in a predetermined condition.) Address decoder 80 also provides an address valid signal to array 12, which outputs data to communication bus 90 in response. Typically, transfers are not allowed during reset; the force transfer allows system 5 to retrieve information from array 12 during reset for use in resetting the part. Note also, that state machine 40 receives the intermediate reset signal and the address valid signal from address decoder 80. State machine 40 is used to control when data is driven onto communication bus 90 via the drive data signal.

Figure 2:
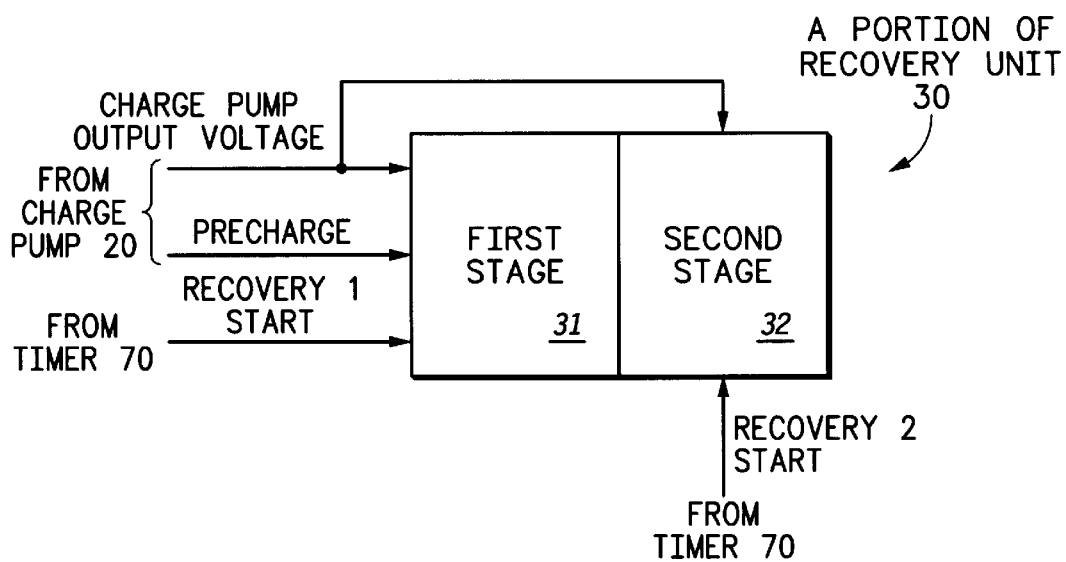
FIG. 2 illustrates in block diagram form a voltage recovery unit of FIG. 1 according to one embodiment of the present invention.

In reference to FIG. 2, a portion of recovery unit 30 is illustrated including the first stage 31 and the second stage 32. In FIG. 2, first stage 31 includes a plurality of p-type devices, or transistors, while second stage 32 includes a plurality of n-type devices, or transistors. First stage 31 receives the charge pump output voltage from charge pump 20, a precharge signal from the charge pump 20, and a recovery 1 start signal from timer 70. First stage 31 is made up of p-channel devices. First stage 31 is used during a first recovery period when the charge pump output voltage is at a higher level. The charge pump output voltage is also provided to second stage 32. Second stage 32 receives a recovery 2 start signal from timer 70. Second stage 32 operates during a second recovery period, where the second recovery period is indicated by the recovery 2 start signal. The recovery operation is performed using the two stages, where the p-type devices are used for higher voltages within p-channel breakdown but outside n-channel breakdown. Alternate embodiments may incorporate any number of stages within recovery unit 30 for converting voltages in multiple stages associated with various voltage levels. A given stage within recovery unit 30 may include a combination of devices having different breakdown voltage requirements, such as n-type and p-type devices. Alternate embodiments of the present invention have multiple recovery periods, where each stage has an associated recovery period.

Figure 3:
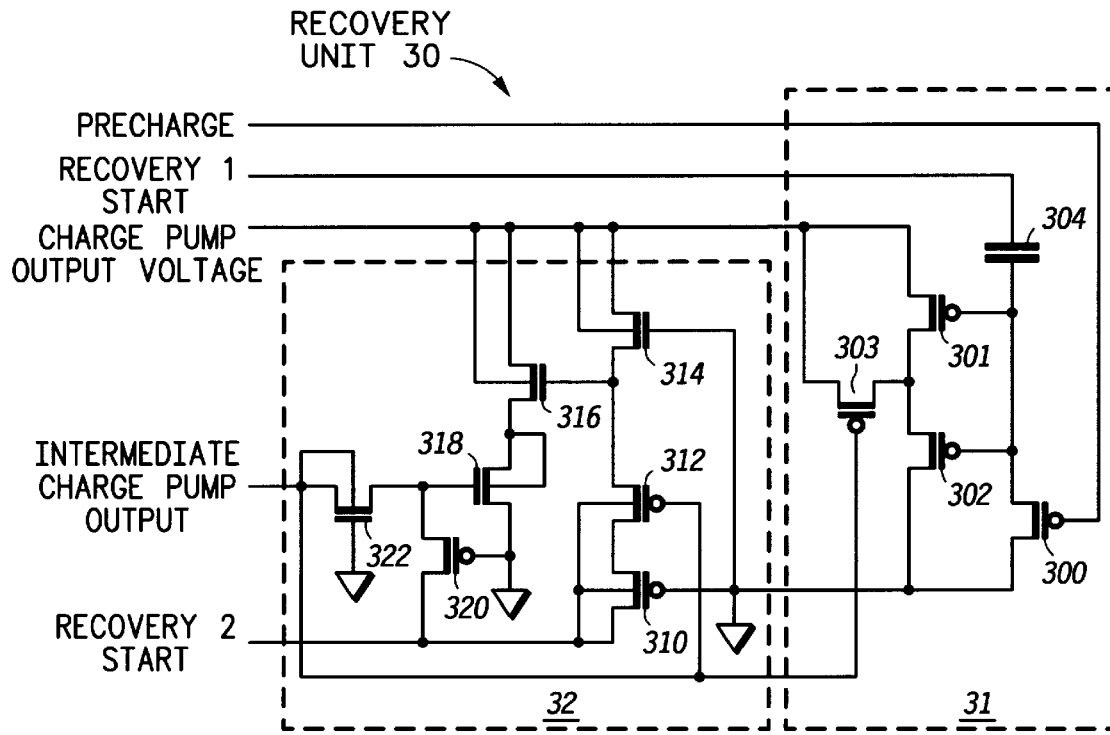
FIG. 3 illustrates in circuit diagram form the voltage recovery unit of FIG. 2 according to one embodiment of the present invention.

FIG. 3 illustrates first stage 31 and second stage 32 according to one embodiment of the present invention. As illustrated in FIG. 3, first stage 31 takes advantage of p-channel device characteristics. According to this embodiment, the first stage 31 receives a precharge signal from charge pump 20, a recovery 1 start signal from timer 70, and charge pump output voltage from charge pump 20. The precharge signal is provided to the gate node of transistor 300. The recovery 1 start signal is provided to one node of capacitor 304. The opposite node of capacitor 304 is coupled to a first node of transistor 300. A second node of transistor 300 is coupled to ground. The charge pump output voltage is provided to one node of transistor 301 and one node of transistor 303. The gate node of transistor 301 is coupled to one side of capacitor 304. One node of transistor 301 is coupled to a node of transistor 303 and a node of transistor 302. A gate node of transistor 302 is coupled to one node of transistor 300. One node of transistor 302 is coupled to ground. Second stage 32 and first stage 31 are each coupled to charge pump output voltage and also to ground.

Within second stage 32, charge pump output voltage is coupled to one node of transistor 316 and one node of transistor 314 of second stage 32. One node of transistor 314 is coupled to the gate node of transistor 316 and one node of transistor 312. The gate node of transistor 312 is coupled to the gate node of transistor 303, coupling first stage 31 to second stage 32. The gate node of transistor 310 is coupled to ground. One node of transistor 312 is coupled to one node of transistor 310. The recovery 2 start signal is provided to one node of transistor 310 and one node of transistor 320. An intermediate charge pump out signal is supplied from charge pump 20 to one node of transistor 322 of recovery unit 30. One node of transistor 322 is coupled to one node of transistor 320 and to the gate node of transistor 318. Charge pump output voltage is coupled to the bulk terminal of transistors 316 and 314. The gate node of transistor 314 is coupled to ground. One node of transistor 316 is coupled to one node of transistor 318 and the bulk terminal of transistor 318. Once node of transistor 318 is coupled to ground. The bulk terminals of transistor 312 and 310 are coupled to recovery 2 start. Intermediate charge pump output is coupled to the bulk terminal of transistor 322. The gate node of transistor 322 is coupled to ground. The gate node of transistor 312 is coupled to the intermediate charge pump output.

Figure 4:
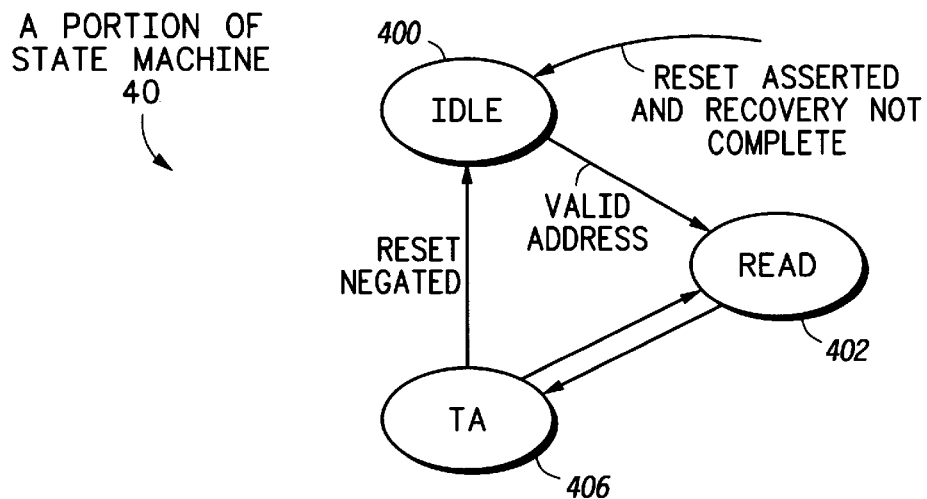
FIG. 4 illustrates in flow diagram form the state diagram of a state machine of FIG. 1 according to one embodiment of the present invention.

Operation of the state machine 40 of FIG. 1 is further illustrated in FIG. 4, where a portion of state machine 40 is illustrated by way of a state diagram. State 400 is an idle state that is entered at the beginning of the recovery period for the charge pump during reset. From state 400, in response to a valid address signal, processing moves to state 402 which is a READ state. State 406 indicates transmission of a transfer acknowledge signal, and processing returns to state 402 while there is a valid address indication. Processing continues back and forth between state 402 and state 406. State 402 indicates a read of data from array 12 of FIG. 1, and state 406 indicates transmission of the transfer acknowledge signal. Once reset is negated, process flow moves from state 406 back to state 400.

Figure 5:
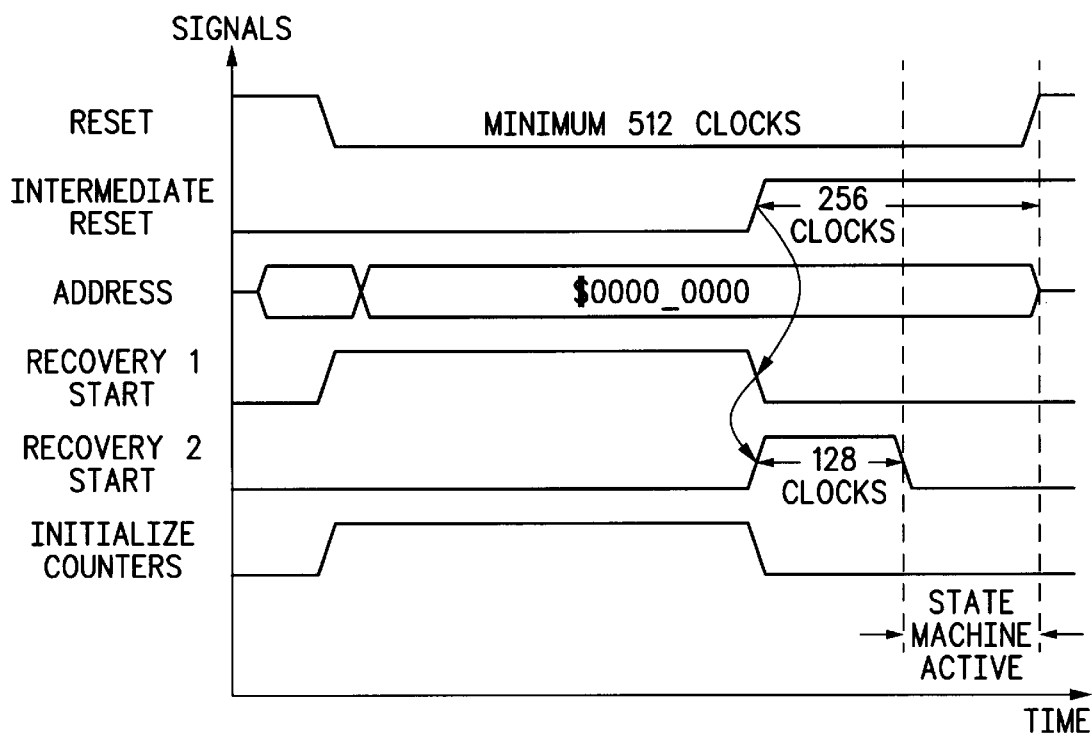
FIG. 5 illustrates in flow chart form a method for synchronizing multiple clocks in accordance with the present invention.

FIG. 5 illustrates, in timing diagram form, various signals within system 5 of FIG. 1. The vertical axis indicates signals within system 5, while the horizontal axis designates time. The signals represented in FIG. 5 include a RESET signal, an intermediate signal, address information, recovery 1 start signal, recovery 2 start signal, and a signal to initialize counters. According to one embodiment of the present invention reset period is 512 clock cycles and the RESET signal is active at a low level. The intermediate reset signal is asserted by the system integration unit 60 about midway through the reset period. The intermediate reset signal is active on a high level. The intermediate reset is asserted after a predetermined number of clocks after assertion of RESET. In this case, the intermediate reset signal is asserted 256 clocks before the end of the reset period. Note that the intermediate reset signal may be asserted at any point within the reset period which allows for completion of the voltage recovery period of recovery unit 30, including the first portion and second portion of the recovery period. According to an alternate embodiment, the intermediate reset signal is generated internally and is based on the RESET signal.

Once RESET is asserted, address is driven during the reset period to the address of a reset configuration vector resident in array 12. According to one embodiment, address is driven to a predetermined hexadecimal value of $0000 0000 throughout the remainder of the reset period, i.e. while RESET is asserted. The reset configuration vector is not driven on the address bus after 10 reset has completed. The recovery 1 start signal is an active high signal that indicates the first portion of the recovery period. The recovery 1 start signal is asserted in response to assertion of reset. The recovery 2 start signal is also active high and is asserted in response to assertion of the intermediate reset signal, and remains asserted at least throughout the remainder of the reset period. The recovery period begins on assertion of the recovery 1 start signal and continues until 128 clocks after assertion of the recovery 2 start signal. The state machine active period, indicated by dashed lines, begins after the 128 clocks have completed, i.e. after the recovery period of recovery unit 30 is completed. The state machine active period continues until the end of the reset period. Note that counters are initialized during the first portion of the recovery period. Alternate embodiments may employ any number of signals and indicators to effect the two portions of the recovery period, and may adjust the timing so as to complete recovery within the reset period.

Figure 6:
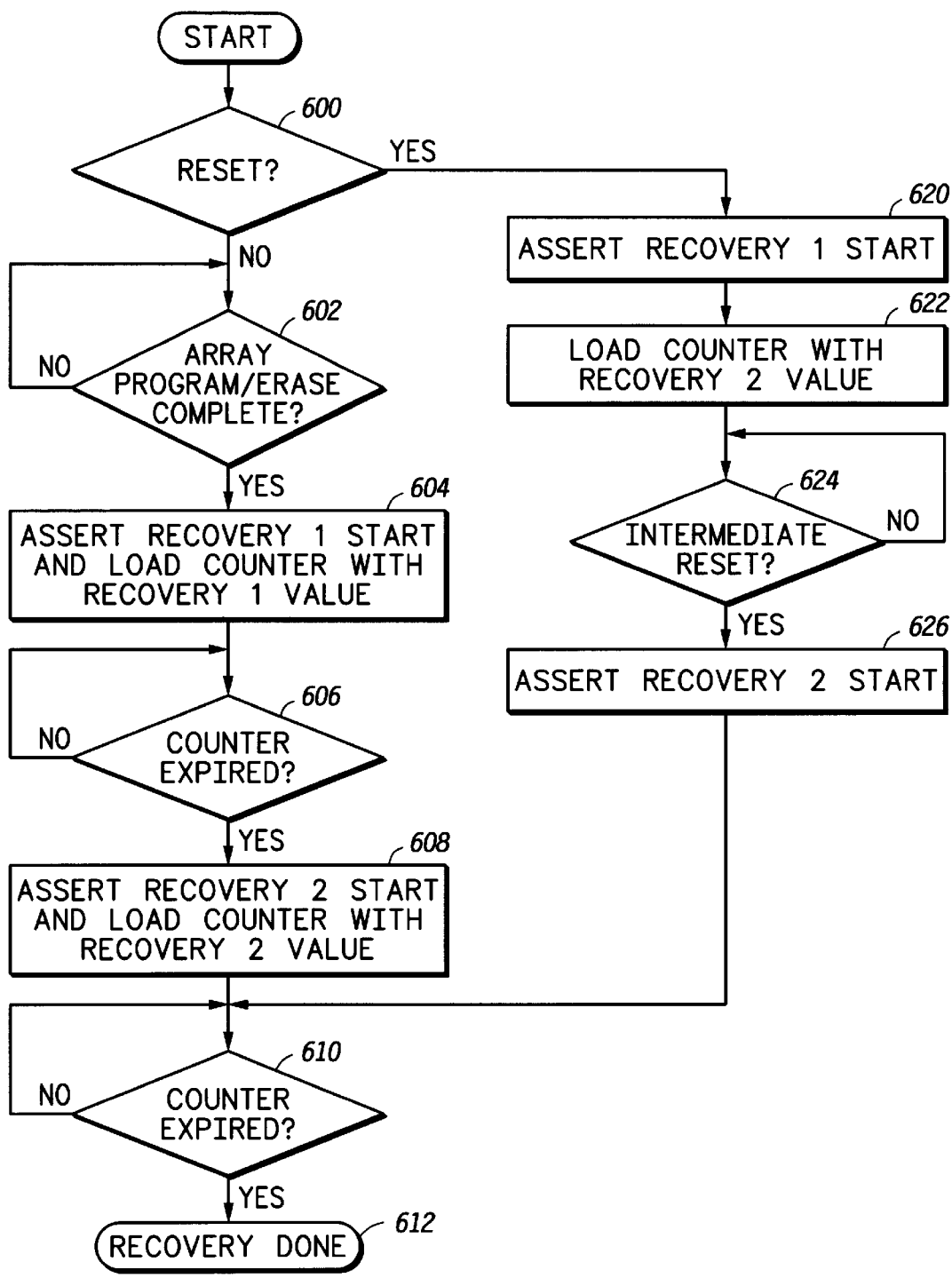
FIG. 6 illustrates in flow chart form a method of voltage recovery according to one embodiment of the present invention.

FIG. 6 illustrates a processing flow diagram describing a recovery operation of recovery unit 30 of FIG. 1, according to one embodiment of the present invention. There are two basic paths for recovery operation corresponding to reset operation and normal operation. At decision diamond 600, the process determines if the part is in reset. This is indicated by assertion of RESET. If RESET is not asserted, the normal operation proceeds to decision block 602, where the process determines if array programming erasing is complete. As indicated by decision diamond 602, the process also checks for erasing, and the terms are interchangeably used herein. If programming is not complete, process flow continues back to decision diamond 602.

Once programming is completed, process flow continues to block 604 to assert recovery 1 start. At block 604 a recovery 1 value is stored in a counter. The recovery 1 start signal is provided from timer 70 to first stage 31 within recovery unit 30. According to one embodiment the counter is decremented, however, alternate embodiments may include a count up counter where the counter is incremented. The counter is used to allow a predetermined number of clocks or amount of time to expire prior to continuation of processing flow. The process determines if the counter has expired at decision block 606. If not, the process loops back to block 606 awaiting expiration. Once the counter expires processing continues to block 608, where the process asserts recovery 2 start. Also at block 608 a recovery 2 start value is stored in a counter. The recovery 1 value is a predetermined value effective for the counter to generate a delay corresponding to the first recovery period. The recovery 2 value is a predetermined value effective for the counter to generate a delay corresponding to the second recovery period. Decision diamond 610 determines if the counter has expired. Once the counter has expired, the recovery process is complete.

Referring again to decision diamond 600, if RESET is asserted, recovery 1 start is asserted at block 620. Processing continues to block 622 to store the recovery 2 value in the counter. Recovery operation during RESET again divides recovery into a first portion and a second portion, however, the intermediate reset signal is generated during reset and provides the starting point of the second portion of the recovery period. The intermediate reset signal indicates the end of the first recovery period and the beginning of the second. The second recovery period is terminated on expiration of a predetermined counter value. Processing flow continues to decision diamond 624 to determine if the intermediate reset signal has been asserted. Note that the intermediate reset signal, as indicated in FIG. 5, signals the start of the second recovery period. Once the intermediate reset signal is asserted, processing flow continues to block 626 to assert recovery 2 start. At this point the counter begins decrementing. Processing flow proceeds then to decision diamond 610 to determine if the counter has expired. Once the counter expires, the recovery period is over.

According to one embodiment of the present invention, the breakdown voltage of the n-channel devices of second stage 32 of FIG. 2, is significantly lower than the voltage necessary for programming memory. This creates a problem in the n-channel portion 32 of recovery unit 30 during conversion of the charge pump voltage. The recovery period is therefore divided into two sections, a first portion and a second portion. During the first portion, only the first stage 31, having p-channel transistors, as illustrated in FIG. 3, converts the voltage from a high level to a lower level. During this portion of the recovery period, only first stage 31 is active, where the first stage 31 contains only p-channel transistors that will not breakdown in the presence of higher voltages. Once the voltage has been brought below the breakdown voltage of the n-channel transistors, the first portion of the recovery period is ended and the second portion of the recovery period begins to ensure usage of the faster n-channel transistors. During the second portion of the recovery period, the n-channel devices or second stage 32 portion of recovery unit 30 is active. The second stage 32 of recovery unit 30 converts the voltage level to the reference voltage, which is approximately ground in one embodiment. The voltage may be converted to any level that is consistent with application and operation of system 5. At the end of the second portion of the recovery period, the recovery unit 30 is deactivated. One aspect of the present invention uses the p-channel transistor portion to bring the voltage down to a first converted level, where the first converted level is below the breakdown voltage of the n-channel transistors. This allows conversion of higher voltages to a voltage within range of the n-channel devices and avoids the limitations of the n-channel transistors. By introducing a second recovery period, during which n-channel transistors are active, it is possible to increase the speed of recovery by using n-channel transistors which are generally faster than equivalently sized p-channel transistors. The first stage 31 and the second stage 32 complement each other providing a flexibility in designing circuits with high voltage requirements at small design geometries while increasing performance and high frequency operation.

Referring again to FIG. 1, address decoder 80 receives a transfer start signal from system integration unit 60 during normal operation. During reset the transfer start signal is negated. During reset, in response to assertion of the RESET signal and in response to the intermediate reset signal, address decoder 80 forces a transfer from array 12 at the address driven on communication bus 90. During reset, system integration unit 60 drives an address of the reset configuration vector into address decoder 80. Address decoder 80 then forces a transfer at the reset configuration address. Array 12 responds by providing the data resident in the configuration register. Address decoder 80 provides an address valid signal to array 12 and the state machine 40, which then initiates the driving of data onto communication bus 90. According to one embodiment of the present invention, the reset configuration vector is housed at address $0000 0000. Alternate embodiments may use any address within array 12 which does not interfere with the normal operation of data processing system 5. According to one embodiment of the present invention, array 12 is flash memory array with EEPROM. The present invention provides a method of designing chips at smaller and smaller geometries, while not limiting the designers to the use of slower p-channel devices to accommodate higher voltages.

The reset configuration word stored in array 12 provides information to describe operation of system 5 after reset. The word is stored in memory within data processor 5. By forcing a data transfer during reset and providing the address of the reset configuration vector, the present invention provides a method for retrieving an uncorrupted configuration word from flash memory during reset by providing a recovery period during reset. The present invention implements a reset without necessity of a separate reset state machine.

According to one embodiment of the present invention, recovery is always initiated during reset, regardless of whether the charge pump voltage level. An intermediate reset signal is provided within 256 clocks of the completion of the reset period to allow the second portion of the recovery period, which is 128 clocks, to complete during the reset period. The first portion of the recovery period is initiated by assertion of RESET and the second portion is initiated by assertion of the intermediate reset signal. During the first portion of the recovery period, counters are initialized for the second portion of the recovery period.

According to one aspect of the present invention, a first voltage recovery period exploits the higher voltage capabilities of p-type devices, while a second voltage recovery period incorporates the higher speed of n-type devices. In this way, the overall speed of the recovery operation is enhanced while allowing for smaller geometry devices. During reset, a signal is generated which allows for the division of the entire recovery operation into the first and second periods. During reset, voltage recovery is completed during the reset cycles, and does not require additional time after reset is complete. By utilizing the two recovery periods, voltage recovery balances a trade-off between higher voltage, robust operation of p-channel devices and high speed n-channel devices.

While the present invention has been illustrated and described with reference to specific embodiments, further modifications and improvements will occur to those skilled in the art. For example, although several uses for the present invention have been described herein, there are a wide variety of circuits requiring a high voltage, such as programmable memory, analog-to-digital converters, etc. operating within an integrated circuit. Note that alternate embodiments of the present invention may incorporate reset periods having various numbers of clock cycles. Alternate embodiments may partition the recovery period into multiple portions, and may initiate or terminate each portion on event(s) within a data processing system, or external to it. The recovery period partitions and timing may be programmable, either by the user or part of a mask option. Other embodiments may have a configuration word address that is any location within memory, or may be sequentially altered with use. Still other embodiments may have multiple intermediate reset signals, and each may be positioned at a predetermined time within the reset period. Further, alternate embodiments may incorporate other types of memory storage devices. It is to be understood, therefore, that this invention is not limited to the particular forms illustrated and that the appended claims cover all modifications that do not depart from the spirit and scope of this invention.

We claim:

1. A data processing system, comprising:
   a central processing unit;
   a communication bus coupled to the central processing unit;
   a memory coupled to the communication bus, comprising:
      a memory array;
      a charge pump coupled to the memory array;
      a recovery unit coupled to the charge pump, the recovery unit having a first portion and a second portion, the first portion active during a first recovery period and the second portion active during a second recovery period;
      a timer, the timer generating a first recovery signal and a second recovery signal to the recovery unit, the first recovery signal indicating start of the first recovery period and the second recovery signal indicating start of the second recovery period.

2. A data processing system as in claim 1, further comprising a system integration unit, the system integration unit generating an intermediate reset indicator, the intermediate reset indicator terminating the first recovery period.

3. A data processing system as in claim 2, wherein the system integration unit generates an address corresponding to a reset configuration word.

4. A data processing system as in claim 3, further comprising:
   an address decoder unit coupled to the communication bus and coupled to the memory array, in response to the system integration unit generating the intermediate reset indicator the address decoder forcing an access to the memory array.

5. A data processing system as in claim 4, further comprising:
   a state machine receiving a reset indicator from the system integration unit;

wherein the timer is responsive to the reset indicator and the intermediate reset indicator to generate a recovery indicator;

wherein the state machine is responsive to the reset indicator and the recovery indicator to initiate provision of the reset configuration word to the communication bus.

6. A method of retrieving a configuration word from a memory in a data processing system, the method comprising the steps of:

asserting a system reset signal;

receiving a configuration word address; and retrieving a configuration word from the memory, wherein the configuration word is retrieved from a location associated with the configuration word address.

7. A method as in claim 6, wherein the step of retrieving comprises the steps of:

providing an address valid signal to the memory; and providing a transfer start signal to the memory.

* * * * *